United States Patent [19]

D'Arrigo et al.

[11] 4,074,334
[45] Feb. 14, 1978

[54] PROTECTIVE DEVICE FOR A POWER ELEMENT OF AN INTEGRATED CIRCUIT

[75] Inventors: Sebastiano D'Arrigo, Sedriano (Milan); Giovanni Ghiringhelli, Segrate (Milan), both of Italy

[73] Assignee: SGS-ATES Componenti Elettronici S.p.A., Agrate Brianza (MI), Italy

[21] Appl. No.: 724,463

[22] Filed: Sept. 17, 1976

[30] Foreign Application Priority Data

Sept. 18, 1975 Italy .................................. 27341/75

[51] Int. Cl.² ............................................. H02H 7/20
[52] U.S. Cl. .......................................... 361/79; 361/56; 330/207 P
[58] Field of Search ............... 361/79, 98, 18, 91, 361/56, 57, 100, 101; 330/207 P

[56] References Cited

U.S. PATENT DOCUMENTS

| | | | |
|---|---|---|---|
| 3,668,545 | 6/1972 | Recklinghausen | 330/207 P |
| 3,786,364 | 1/1974 | Wheatley, Jr. | 330/207 P |
| 3,992,678 | 11/1976 | Suzuki | 361/98 X |

*Primary Examiner*—J D Miller
*Assistant Examiner*—Patrick R. Salce
*Attorney, Agent, or Firm*—Karl F. Ross

[57] ABSTRACT

A protective device limiting the current flow through a power transistor 11 in a final stage of an integrated circuit comprises, as part of that circuit, a normally nonconductive shunt transistor 31 which is turned on by a monitoring transistor 22 whenever the collector current I and the collector-emitter voltage $V_{CE}$ of the power transistor reach values beyond a protective curve 52 plotted on a current/voltage diagram. The base-emitter circuit of the monitoring transistor 22 is connected across an output resistor $R_2$, in series with the power transistor 11, via a diode 21 of logarithmic conduction characteristic, that diode being also connected across the power transistor in series with a voltage-sensing network. This network includes a voltage divider $R_3$, $R_5$ in series with a Zener diode 33, the voltage divider being connected in parallel with a switching transistor 35 whose base is tied to a tap of the divider.

6 Claims, 3 Drawing Figures

4,074,334

PROTECTIVE DEVICE FOR A POWER ELEMENT OF AN INTEGRATED CIRCUIT

FIELD OF THE INVENTION

Our present invention relates to integrated circuitry including a power element, such as a final transistor, as well as a protective device designed to confine the output current of that element along with the accompanying voltage drop thereacross to values lying within a predetermined area of a current/voltage diagram partly bounded by a generally exponential curve.

BACKGROUND OF THE INVENTION

In commonly owned U.S. Pat. No. 3,792,316 there has been described such a system in which the output current is fed to an external connector by way of a calibrated wire. The system includes monitoring means for measuring the current delivered by the power element directly to the calibrated wire.

In some practical applications of the device described in the above-identified patent it has been found that the resistance of the calibrated wire extending to the external connector, even if only of the order of a few tens of milliohms, is too great and, therefore, in the case of high currents, the wire heats up excessively, causing an undesired increase in the temperature of the integrated circuit and, accordingly, a limiting of the power output of that circuit.

Furthermore, in the system described in the aforementioned patent, the protective circuit for a power transistor is designed in such a manner that the resultant relationship between the current which passes through the power transistor and the voltage present between the terminals thereof is of exponential character, on account of the presence of a diode in the circuit for the processing of the variables which are being monitored. By suitably selecting the value of the components of the circuit, this relationship is represented, in the characteristic diagram of the power transistor by a curve which approaches partly the curve of maximum dissipation and partly the second breakdown curve of the power transistor, as shown in the graph given in FIG. 3 of U.S. Pat. No. 3,792,316. In this way, the transistor is enabled to operate safely under conditions very close to those limits, thus optimally utilizing the integrated circuit.

It has been noted, however, that with many types of power transistors the variations of the parameters permitted by the aforedescribed circuit are not sufficient to obtain satisfactory approximation of the second breakdown curve. In many cases, therefore, the protective circuit excessively limits the useful range of operation of the transistor, namely the power which can be dissipated by it.

OBJECT OF THE INVENTION

The object of the present invention is to provide an improved protective device of the general type described in U.S. Pat. No. 3,792,316 which obviates the aforementioned drawbacks and yields an optimum protective curve for any type of power transistor used in the integrated circuit.

SUMMARY OF THE INVENTION

In the present system, as in the one of the prior patent, the protective device comprises a monitoring amplifier with input connections across and output resistance in series with the power element, these input connections including a unidirectionally conductive component such as a diode with a generally logarithmic conduction characteristic connected to a junction of this resistance with the power element, specifically with the emitter of the output transistor constituting that element. The monitoring amplifier, responding to the output current which traverses the aforementioned resistance, controls a threshold circuit which is connected to an input of the power element and serves to shunt out part of an incoming signal whenever the values of the output current and the accompanying voltage drop across the power element approach the boundary of the safety area of the current/voltage diagram. Whereas, however, the prior system has a simple voltage-sensing resistor connected in series with the unidirectionally conductive component across the power element, our present improvement provides for the replacement of that resistor by a voltage-sensing network including a series combination of electronic switch means, such as a switching transistor, and two-terminal breakdown means such as a Zener diode having a substantially current-independent voltage upon reaching a predetermined firing potential. The switching transistor significantly modifies the resistance of the network in a voltage range exceeding that firing potential, as will become apparent hereinafter.

BRIEF DESCRIPTION OF THE DRAWING

The above and other features of our invention will now be described in detail hereinafter with reference to the accompanying drawing in which.

SPECIFIC DESCRIPTION

Figure 1:
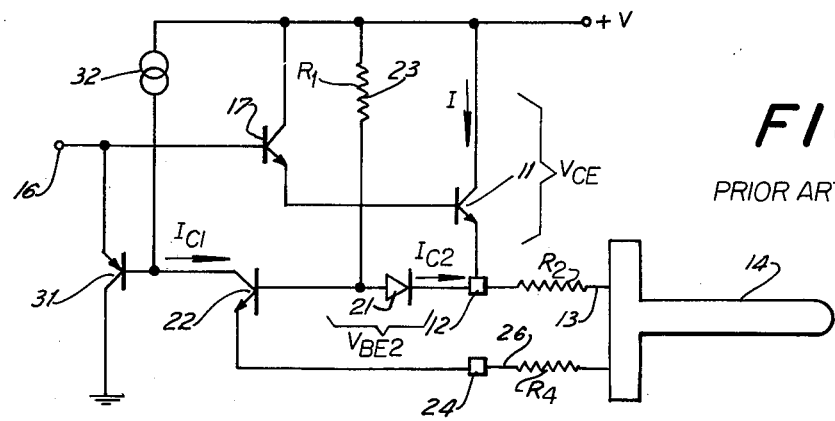
FIG. 1 shows the wiring diagram of part of an integrated circuit comprising a final-stage power transistor and a protective device of the type described in Pat. No. 3,792,316.

The system of FIG. 1 corresponds to that of commonly owned U.S. Pat. No. 3,792,316 to which reference may be made for further details. It comprises an NPN power transistor 11, representing a final stage of an integrated circuit illustrated only in part, whose collector receives operating voltage from a supply lead $+V$ and whose emitter is tied to a metallic tab 12 constituting an output terminal of the integrated circuit. A conductor 13, whose distributed resistance has been symbolically indicated at $R_2$, links the tab 12 with an external connector 14 which is linked by way of another lead 26, with distributed resistance $R_4$, to a tab 24. An input 16 is connected in parallel to the base of an NPN pilot transistor 17 and to the emitter of a PNP shunt transistor 31 whose collector is grounded. The collector of transistor 17 is tied to voltage supply $+V$ whereas its emitter is connected to the base of power transistor 11. An NPN monitoring transistor 22 has its collector tied to the base of shunt transistor 31 and energized from supply $+V$ via a constant-current generator 32, the emitter of transistor 22 being connected to terminal tab 24. The base of monitoring transistor 22 is connected to voltage $+V$ via a resistor 23 and to terminal 12 via a diode 21 whose presence, as explained in the patent, makes the collector current I of power transistor 11 vary exponentially with the collector-emitter voltage $V_{CE}$ of that transistor as a function of the junction voltage $V_{BE2}$ of the diode; voltage $V_{CE}$ lies across the series combination of the resistance $R_1$ of resistor 23 and the forward resistance of diode 12.

Figure 2:
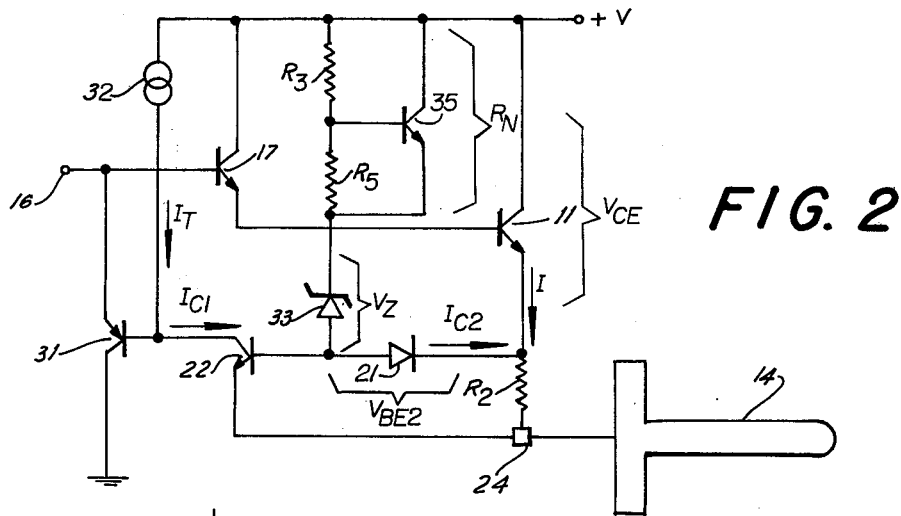
FIG. 2 shows a similar circuit diagram including a protective device according to our present invention.

The system according to our invention, shown in FIG. 2, differs from the prior-art system of FIG. 1 mainly by the replacement of voltage-sensing resistor 23 with a resistive network including an NPN switching transistor 35 in series with a Zener diode 33, the collector of this transistor being energized directly from voltage supply +V whereas its base is tied to the junction of two resistors $R_3$ and $R_5$ constituting a voltage divider connected across the collector-emitter path of transistor 35. It will also be noted that the emitter of power transistor 11 and the cathode of diode 21 are connected via output resistance $R_2$ to terminal tab 24, with omission of tab 12 and wire 13; tab 24 is linked with connector 14 by a lead 36. Resistance $R_2$ is part of a surface zone of the integrated circuitry, the metallic tab 24 being disposed on that zone.

The operation of the circuit of FIG. 2 is similar to that of prior-art circuit shown in FIG. 1. Thus the diode 21, the transistor 22, and the voltage-sensing network consisting of the diode 33, the resistors $R_3$, $R_5$ and the transistor 32 have the function of deriving from the current I + $I_{C2}$ which passes through the resistor $R_2$, and from the collector-emitter voltage $V_{CE}$ of the power transistor 11 a signal which is sent to the threshold circuit formed of the transistor 31 and the constant-current generator 32. Thus, when the collector current of the transistor 22 reaches a value equal to the predetermined value $I_T$ of the reference current of the generator, the protective device is actuated by the conduction of transistor 31 and, accordingly, the output current I is limited to a value which can be tolerated by the transistor 11 which is to be protected.

It has already been pointed out that thanks to the presence of the diode 21 in the circuit monitoring the output voltage and current of the transistor 11, the course of the protective curve is substantially exponential. This is clear from the calculation included in the prior patent for the circuit of FIG. 1, which leads to the following relationship between the current I and the voltage $V_{CE}$ of the transistor 11:

$$I = kT/qR_2 \cdot \ln[(A_2/A_1 \cdot I_T R_1) / (V_{CE} - V_{BE2})] \quad (1)$$

wherein, besides the parameters already defined,
$A_1$ is the emitter area of the transistor 22,
$A_2$ is the junction area of the diode 21,
$q$ is the electron charge,
$k$ is the Boltzmann constant, and
T is the absolute temperature of the junctions.

It can easily be demonstrated that for the circuit in accordance with our present invention, shown in FIG. 2, the relationship (1) is still valid if there is added, in the expression within parentheses ($V_{CE} - V_{BE2}$) the value $V_Z$, with negative sign, of the breakdown voltage of the Zener diode 33 and there is substituted for $R_1$ the resistance $R_N$ of the network section consisting of the resistors $R_3$, $R_5$ and the transistor 32, i.e.:

$$I = kT/qR_2 \cdot \ln[(A_2/A_1 \cdot I_T R_N)/(V_{CE} - V_{BE2} - V_Z)] \quad (2)$$

Figure 3:
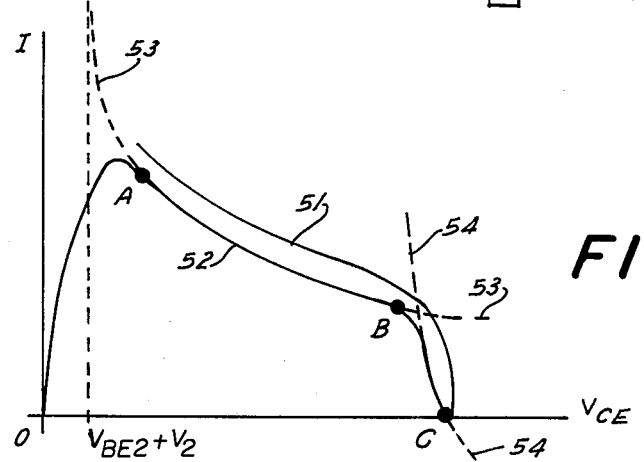
FIG. 3 is a graph which shows, for a given temperature level, the second breakdown curve of the power transistor of the circuit of FIG. 2 and the protection curve obtained with the system embodying our invention.

A typical second breakdown curve of a power transistor is indicated at 51 in the graph of FIG. 3. In a first zone corresponding to high values of $V_{CE}$, curve 52 is lower than the curve of maximum dissipation (not shown) and therefore predominant for purposes of the determination of a protective curve. In a second zone corresponding to small values of $V_{CE}$ and high currents, the maximum-dissipation curve acts as boundary of the area of reliable operation of the power transistor. This second zone is not taken into consideration in the examination of the operation of the protective device in accordance with the invention since it is presupposed that the integrated circuit contains a device to protect against excessive temperatures which in practice automatically limits the area of operation of the power transistor to below the maximum-dissipation curve. One method of obtaining this protective action, described in the prior patent, consists substantially in suppressing the reference current $I_T$ at a given maximum temperature.

The protective curve 52 of FIG. 3 may be subdivided basically into three segments. The first extends from the point of origin O to a point A lying on an exponential curve 53, the second is bounded by the point A and a point B of curve 53, and the third extends from the point B to a point C essentially along another exponential curve 54. The segment OA has a course which is determined by the saturation operating conditions of the transistor 11 and is within the area of safe operation of that transistor. For the voltage and current values represented by the segment OA, the voltage across the Zener diode 33 is less than the breakdown level $V_Z$ thereof and therefore the voltage-sensing network 33, 35, $R_3$, $R_5$ is not traversed by current and does not affect the operation of the power transistor 11. As soon as the breakdown voltage $V_2$ has been reached, the emitter potential of transistor 11 becomes equal to $V_{CE} - V_Z$. By suitably dimensioning the two resistors $R_3$ and $R_5$ the network resistance $R_N$ has a constant value establishing the curve 53 as long as the switching transistor 35 is cut off. As soon as the current passing through resistor $R_5$ is such as to bring the transistor 35 to saturation, the voltage $R_N$ is reduced to the value of $V_{CEsat}$ of the saturation voltage the transistor 35. Under these conditions, the magnitude of $R_N$ becomes extremely low and the protective curve assumes, near the point B, the course of the curve 54. This course is very similar to that of the part of the second breakdown curve 51 corresponding to the higher values of $V_{CE}$.

The function of the Zener diode 33 is to shift the curve segment A-B parallel to itself. The extent of the displacement, of course, depends on the value of the firing voltage of the Zener diode. In practice, several Zener diodes can be used in series in order to obtain the desired displacement. Similar displacements can be obtained also by varying the value of the resistance $R_N$; however, when higher resistance values are necessary for the desired displacement it is more convenient to use additional Zener diodes rather than larger resistors in view of the substantial amount of space taken up by the latter in an integrated circuit.

From what has been stated above it is clear that, by suitably dimensioning the components of the circuit according to our invention, we can obtain a protective curve which makes it possible to obtain the maximum benefit from the power transistor.

Otherwise, the operation of the circuit of FIG. 2 is similar to that of the prior-art circuit of FIG. 1. In particular, as soon as the collector current $I_c$ of the transistor 22 reaches the value of the reference current $I_T$ as the result of an excessive increase in the output current and/or voltage of the transistor 11, the transistor 31 starts to operate and therefore a part of the signal present at the input 16 is short-circuited to ground via transistor 31; thus, the output current I remains limited to a permissible value corresponding to a point of the protective curve. The essential difference between our improved system and that of the prior patent is the greater flexibility of the protective curve thus obtained, namely the possibility of acting on a larger number of parameters in order to obtain, for any power transistor to be protected, the protective curve which is best suited to utilize to the maximum the operating area of the transistor.

Although only a single embodiment has been described, it is obvious that numerous modifications may be made therein without going beyond the scope of the invention. For example, the resistor $R_2$ may be a metallic or other resistive element and may be integrated in the circuit or may be discrete, provided that it is of the order of a few tens of milliohms and can be produced with very close tolerances. The voltage-sensing network inserted between the base of the transistor 22 and the supply lead $+V$ may also be different from that shown, provided that its operation is such as to produce a resistance which suddenly decreases when the voltage thereacross exceeds a predetermined limit so as to make possible one or more sudden variations in slope of the protective curve in order to follow as closely as possible the course of the second breakdown curve of the power element to be protected.

We claim:

1. In integrated circuitry including a power element traversed by an output current and a protective device for confining the values of said output current and of an accompanying voltage drop across said power element to a predetermined area of a current/voltage diagram partly bounded by a generally exponential curve, the improvement wherein said protective device comprises:

an output resistance in series with said power element;

a monitoring amplifier with input connections across said output resistance, said input connections including a unidirectionally conductive component with a generally logarithmic conduction characteristic connected to a junction of said power element with said output resistance;

a threshold circuit connected across an input of said power element and controlled by said monitoring amplifier for shunting out part of an incoming signal upon said values approaching said boundary; and a voltage-sensing network connected in series with said component across said power element, said network including a series combination of electronic switch means and two-terminal breakdown means having a substantially current-independent voltage upon reaching a predetermined firing potential, said switch means significantly modifying the resistance of said network in a voltage range exceeding said firing potential.

2. The improvement defined in claim 1 wherein said power element is an output transistor having an emitter, a collector and a base, said junction being formed between said output resistance and said emitter 3. The improvement defined in claim 1 wherein said breakdown means comprises a Zener diode.

4. The improvement defined in claim 1 wherein said switch means comprises a transistor with a collector-emitter circuit shunted by a voltage divider and with a base connected to a tap on said voltage divider.

5. The improvement defined in claim 1 wherein said output resistance is part of a surface zone of said integrated circuitry and terminates at a metallic tab on said surface zone, said input connections including a lead extending to said tab.

6. The improvement defined in claim 1 wherein said unidirectionally conductive component is a diode.

* * * * *